United States Patent [19]

Davies et al.

[11] Patent Number: 5,510,648

[45] Date of Patent: Apr. 23, 1996

[54] INSULATED GATE SEMICONDUCTOR DEVICE AND METHOD OF FABRICATING

[75] Inventors: Robert B. Davies, Tempe; Peter J. Zdebel, Mesa; Juan Buxo, Tempe, all of Ariz.

[73] Assignee: Motorola, Inc., Schaumburg, Ill.

[21] Appl. No.: 301,999

[22] Filed: Sep. 7, 1994

Related U.S. Application Data

[62] Division of Ser. No. 177,034, Jan. 4, 1994, Pat. No. 5,372,960.

[51] Int. Cl.⁶ .......................... H01L 29/36; H01L 29/167
[52] U.S. Cl. .......................... 257/657; 257/335; 257/365; 257/389; 257/395; 257/404; 257/900
[58] Field of Search .................... 257/335, 364, 257/365, 366, 389, 395, 402, 403, 404, 405, 657, 900

[56] References Cited

U.S. PATENT DOCUMENTS

| | | | |
|---|---|---|---|
| 4,949,136 | 8/1990 | Jain | 257/900 |
| 5,170,232 | 12/1992 | Narita | 257/338 |
| 5,371,394 | 12/1994 | Ma et al. | 257/335 |

FOREIGN PATENT DOCUMENTS

| | | | |
|---|---|---|---|
| 0387722 | 9/1990 | European Pat. Off. | 257/335 |
| 52-22480 | 2/1977 | Japan | 257/335 |
| 56-33881 | 4/1981 | Japan | 257/403 |
| 63-44769 | 2/1988 | Japan | 257/389 |
| 3-178169 | 8/1991 | Japan | 257/365 |
| 4-58566 | 2/1992 | Japan | 257/900 |
| 4-154171 | 5/1992 | Japan | 257/404 |

*Primary Examiner*—Sara W. Crane
*Assistant Examiner*—Alice W. Tang
*Attorney, Agent, or Firm*—Rennie William Dover

[57] ABSTRACT

An insulated gate semiconductor device (10) having a pseudo-stepped channel region (20B) between two P-N junctions (21B and 22B). The pseudo-stepped channel region (20B) is comprised of an enhancement mode portion (26B) and a depletion mode portion (28B), the enhancement mode portion (26B) being more heavily doped than the depletion mode portion (28B). One P-N junction (21B) is formed at an interface between a source region (18B) and the enhancement mode portion (26B). The enhancement mode portion (26B) has a substantially constant doping profile, thus slight variations in the placement of the source region (18B) within the enhancement region (26B) do not result in significant variations in the threshold voltage of the insulated gate semiconductor device (10). The insulated gate semiconductor device (10) is well suited for the design of low voltage circuits because of the small variations of the threshold voltage.

16 Claims, 7 Drawing Sheets

INSULATED GATE SEMICONDUCTOR DEVICE AND METHOD OF FABRICATING

This is a division of application Ser. No. 08/177,034, filed Jan. 4, 1994, now U.S. Pat. No. 5,372,960.

FIELD OF THE INVENTION

The present invention relates, in general, to insulated gate semiconductor devices, and more particularly, to controlling a threshold voltage, $V_T$, in insulated gate semiconductor devices.

BACKGROUND OF THE INVENTION

As those skilled in the art ate aware, $V_T$ is related to the voltage at which an insulated gate semiconductor device turns on and varies in accordance with the carrier concentration of the channel region. For example, the gate-source voltage ($V_{GS}$) of an n-channel insulated gate semiconductor device muse exceed $V_T$ to form a channel in the insulated gate semiconductor device. Since the voltage at the gate is typically the input voltage of the insulated gate semiconductor device, the input voltage relative to the source voltage must exceed $V_T$ for a conducting channel to be formed. In other words, a significant drain current ($I_D$) will not flow through a channel region of the insulated gate semiconductor device unless $V_{GS}$ is greater than $V_T$. In addition, $V_T$ is important in determining the saturation current of an insulated gate semiconductor device, which in turn helps to determine the power bandwidth of the device.

Although precise control of $V_T$ is highly desirable in all insulated gate semiconductor device applications, it is particularly important in low voltage applications. In insulated gate semiconductor devices using standard power supply levels, the difference between the upper power supply rail (5 volts) and the lower power supply rail (0 volts) is sufficiently large, i.e., approximately 5 volts, that fluctuations in $V_T$ have a negligible effect on the device performance. However, in low voltage applications when the difference between the power supply rails is less than 1.5 volts, $V_T$ represents a substantial portion of the total power supply voltage. Consequently, fluctuations in $V_T$ results in large fluctuations of the current drive capability of the insulated gate semiconductor device.

Accordingly, it would be advantageous to have an insulated gate semiconductor device and method of manufacturing the insulated gate semiconductor device wherein the threshold voltage is suitably controlled for low voltage insulated gate semiconductor device applications.

DETAILED DESCRIPTION OF THE DRAWINGS

Generally, the present invention provides an integrated device and a method of fabricating or forming the integrated device. More particularly, the present invention provides a method of fabricating an insulated gate semiconductor device having significantly improved control of threshold voltage, $V_T$. In the insulated gate semiconductor device of the present invention, $V_T$ is controlled by forming a stepped concentration channel insulated gate semiconductor device having relatively short, highly doped, channel portion and a relatively long, lightly doped, channel portion, wherein the short and long channel portions have substantially uniformly doped surface concentrations.

Figure 1:
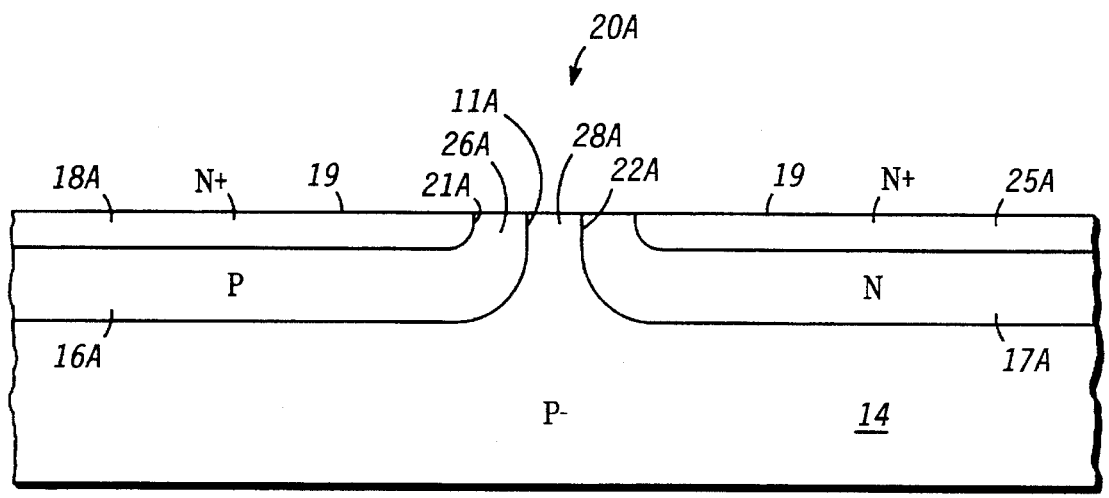
FIG. 1 illustrates a highly enlarged cross-sectional view of a portion of an insulated gate semiconductor device having a stepped channel region in accordance with the present invention.

FIG. 1 illustrates a highly enlarged cross-sectional view of a portion of a unilateral N-channel insulated gate semiconductor device 10 having stepped channel regions 26A and 28A in accordance with the present invention. It shall be understood that a unilateral device is nonsymmetric and has improved performance when operated in one direction. The insulated gate semiconductor device 10 comprises an epitaxial layer 14 of P conductivity type having a major surface 19. A body region 16A and a lightly doped drain extension region 17A are formed in the epitaxial layer 14, wherein the regions 16A and 17A are laterally spaced apart from each other and of P conductivity type and N conductivity type, respectively. Source region 18A and enhanced drain contact region 25A are formed in a portion of the regions 16A and 17A, respectively, adjacent a major surface 19 of the epitaxial layer 14. A P-N junction 21A is formed at the intersection of the source region 18A and the body region 16A. Another P-N junction 22A is formed at the intersection of the lightly doped drain extension region 17A and the epitaxial layer 14.

The channel region 20A is comprised of an enhancement mode portion 26A and a depletion mode portion 28A. The portion of the body region 16A between the source region 18A and the portion of the epitaxial layer 14 adjacent the major surface 19 and between the regions 16A and 17A serves as the enhancement mode portion 26A. The portion of the epitaxial layer 14 between the enhancement mode portion 26A and the lightly doped drain extension junction 22A serves as the depletion mode portion 28A. The intersection between the enhancement mode portion 26A and the depletion mode portion 28A establishes the step in the channel at location 11A. The portion of the insulated gate semiconductor device 10 briefly described in FIG. 1 has been presented to facilitate an understanding of the impurity profile illustrated in FIG. 2. The insulated gate semiconductor device 10 will be further described with reference to FIGS. 4–14.

Figure 2:
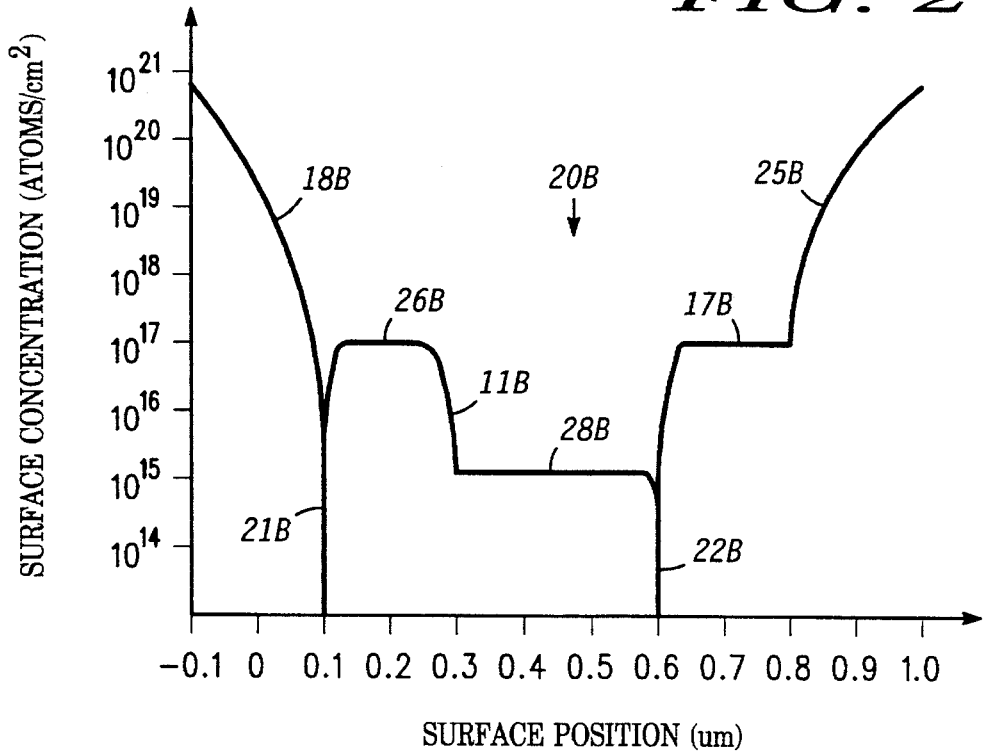
FIG. 2 is a surface impurity profile of an insulated gate semiconductor device having a stepped channel region in accordance with the present invention.

FIG. 2 is a surface impurity profile of the insulated gate semiconductor device 10 having the stepped channel region in accordance with the present invention. The impurity profile of FIG. 2 illustrates the surface impurity profile as a function of lateral position across the major surface 19 of the insulated gate semiconductor device 10. The ordinate represents the surface concentration and the abscissa represents the relative surface position. The region indicated by reference numeral 18B is the surface concentration in the source region 18A and the region indicated by the reference numeral 25B is the surface concentration in the enhanced drain contact region 25A of FIG. 1. The region indicated by the reference numeral 21B is the P-N junction between the source region 18A and the enhancement mode portion 26A, and the region indicated by the reference numeral 22B is the P-N junction between the lightly doped drain extension portion 17A and the epitaxial layer 14 shown in FIG. 1. It shall be understood that the same reference numerals are used in the figures to denote the same elements.

The enhancement mode portion 26A of FIG. 1 is denoted in FIG. 2 by the reference numeral 26B and the depletion mode portion is denoted by the reference numeral 28B. The lightly doped drain extension 17A is denoted by reference numeral 17B in FIG. 2. The stepped channel region is between the P-N junctions 21B and 22B, wherein the step is indicated by the reference numeral 11B.

In the present invention, the total channel length 20B is the sum of the lengths of the enhancement and depletion mode portions, 26B and 28B, respectively. However, it should be noted that the measured performance of the device of the present invention demonstrates that its effective channel length is substantially represented by the enhancement mode portion 26B. By way of example, the total channel length of the insulated gate semiconductor device in accordance with the present invention represented by FIG. 2 is approximately 0.5 micrometers (μm). The enhancement mode portion 26B is approximately 0.2 μm of the total channel length, whereas the depletion mode portion is approximately 0.3 μm of the total channel length. Thus, the enhancement mode portion 26B represents approximately 40% of the total channel length. Further, the peak carrier concentration, i.e., the peak dopant concentration, in the enhancement mode portion 26B is on the order of $10^{17}$ atoms/cm$^3$ (atoms/cubic centimeter), whereas the peak dopant concentration of the depletion mode portion is on the order of $10^{15}$ atoms/cm$^3$. Accordingly, the total charge in the enhancement mode portion 26B is greater than that of the depletion mode portion 28B, hence most of the total channel region charge is in the enhancement mode portion 26B. Since the $V_T$ of the insulated gate semiconductor device is strongly influenced by the carrier concentration, the present invention stabilizes the $V_T$ of the insulated gate semiconductor device by creating a portion of the channel region having a high carrier concentration, i.e., enhancement mode portion 26B, such that the source region 18B intersects the enhancement mode portion 26B of the channel region at a point where the carrier concentration is relatively constant. Thus, small variations in the placement of the source region 18B have a relatively insignificant effect on the insulated gate semiconductor devices threshold voltage, $V_T$.

Figure 3:
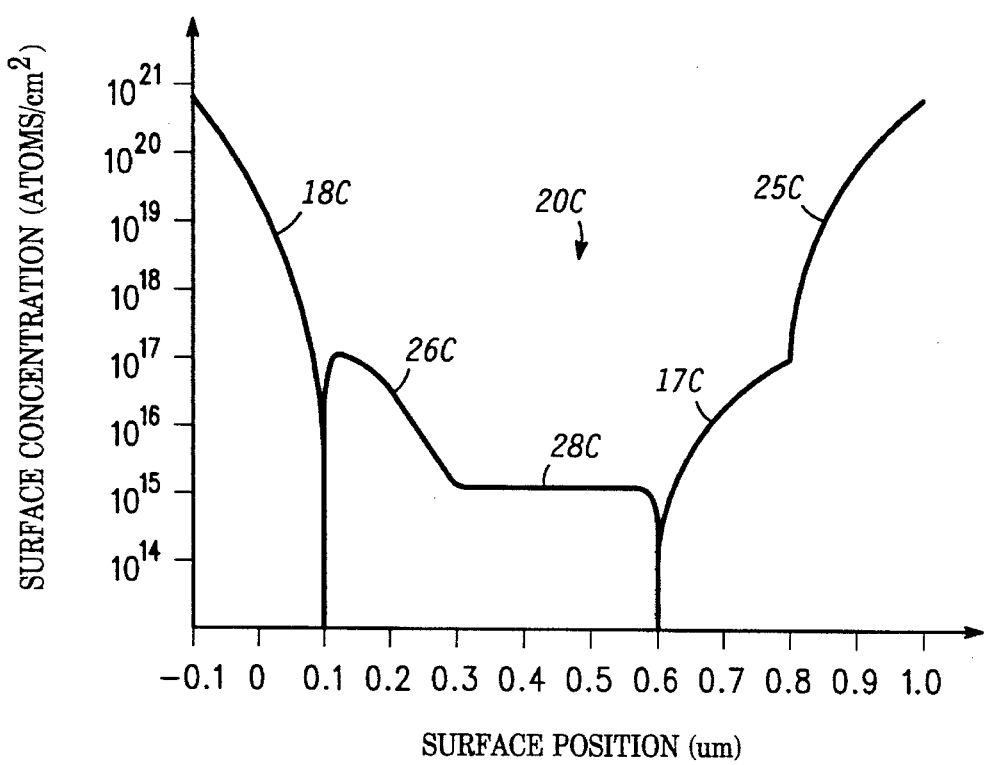
FIG. 3 is a surface impurity profile of a prior art insulated gate semiconductor device having a graded channel region.

To provide a comparison with a prior art impurity profile, FIG. 3 illustrates an impurity profile of a prior art insulated gate semiconductor device. The impurity profile of FIG. 3 illustrates a source region 18C and an enhanced drain contact region 25C. The enhancement region 26C and the lightly doped drain extension 17C demonstrate a graded carrier concentration profile, whereas the enhancement mode region 26B and the drain extension region 17B of the preferred embodiment of the present invention (FIG. 2) demonstrate a pseudo-abrupt, step function, change in carrier concentration rather than the graded profile of the prior art.

FIGS. 4–14 are highly enlarged cross-sectional views of an insulated gate semiconductor device 10 having a stepped concentration channel region during processing in accordance with the present invention. Although specific materials, conductivity types, thicknesses, and other parameters are set forth herein, it should be understood that these are not meant to be limiting.

Figure 4:
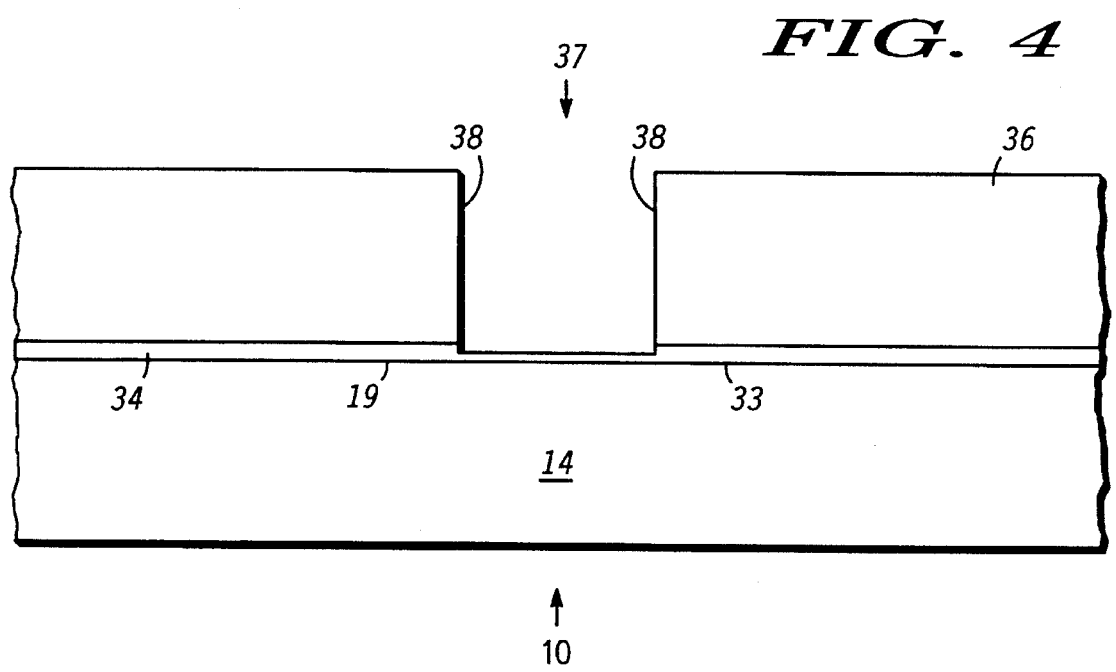
FIGS. 4–14 illustrate highly enlarged cross-sectional views of a portion of an insulated gate semiconductor device during processing in accordance with a unilateral embodiment of the present invention.

FIG. 4 illustrates a semiconductor substrate 14 having a major surface 19. The substrate 14 may be, for example, an epitaxial layer formed by methods well known in the art. The epitaxial layer 14 is lightly doped with a P type impurity material having a dopant concentration or level on the order of $10^{15}$ to $10^{16}$ atoms/cm$^3$. A protective oxide layer 33 is thermally grown on the epitaxial layer 14 and has a thickness of, for example, approximately 105 angstroms. A layer of silicon nitride 34 is deposited on the oxide layer 33 using a low pressure chemical vapor deposition (LPCVD) system. An oxide layer 36 is formed on the layer of silicon nitride 34 by the decomposition of tetraethyl orthosilicate, TEOS. Oxide layers formed by the decomposition of tetraethyl orthosilicate are commonly referred to as TEOS layers. By way of example, the layer of silicon nitride 34 has a thickness of approximately 750 angstroms, and the oxide layer 36 has a thickness of approximately 7,000 angstroms. A cavity 37 extending through the oxide layer 36 and into the layer of silicon nitride 34 is formed using techniques well known to those skilled in the art. The cavity 37 has sidewalls 38, and exposes a portion of the layer of silicon nitride 34. By way of example, the cavity 37 has a width of approximately 0.8 μm.

Figure 5:
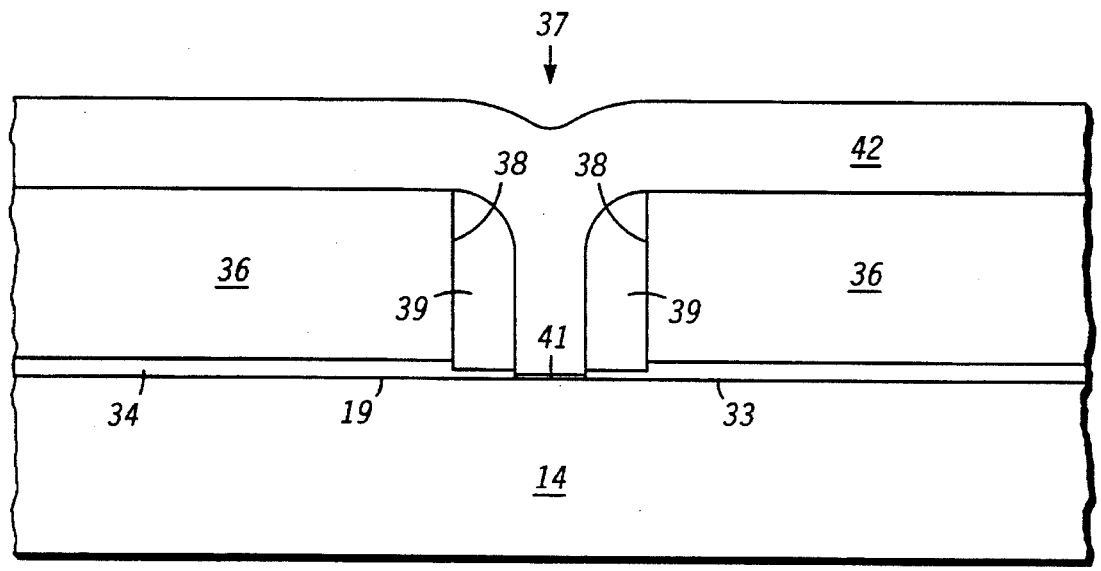

Now referring to FIG. 5, a conformal TEOS layer (not shown) having a thickness of, for example, 2,500 angstroms is deposited on the oxide layer 36 and on the exposed portion of the layer of silicon nitride 34. Thus, the conformal TEOS layer partially fills the cavity 37 and conformally lines the sidewalls 38 of the cavity 37. The conformal TEOS layer disposed on the oxide layer 36 and on the exposed portion of the layer of silicon nitride 34 is anisotropically etched, preferably by reactive ion etching (RIE). The anisotropic etch forms oxide spacers 39 along the sidewalls 38 of the cavity 37. In addition, the exposed portion of the silicon nitride layer 34 is etched. The anisotropic etch stops on or in the exposed protective oxide layer 33 at the bottom of cavity 37. The exposed portion of the protective oxide layer 33 is removed by a wet chemical etch, thereby exposing the surface 19 of the epitaxial layer 14.

A gate oxide layer 41 is formed on the exposed portion of the epitaxial layer 14 between the sidewall spacers 39. The gate oxide layer 41 serves as an insulating layer formed in a first portion of the gate structure. A layer of polysilicon 42 is formed conformally on the oxide layer 36, the oxide spacers 39, and on the gate oxide layer 41. The layer or polysilicon 42 fills the cavity 37 and covers the oxide layer 36. By way of example, the gate oxide layer 41 has a thickness of approximately 105 angstroms and the layer of polysilicon 42 on the oxide layer 36 has a thickness of approximately 4,000 angstroms. Methods of forming the gate oxide layer 41 and the layer of polysilicon 42 are well known to those skilled in the art.

Figure 6:
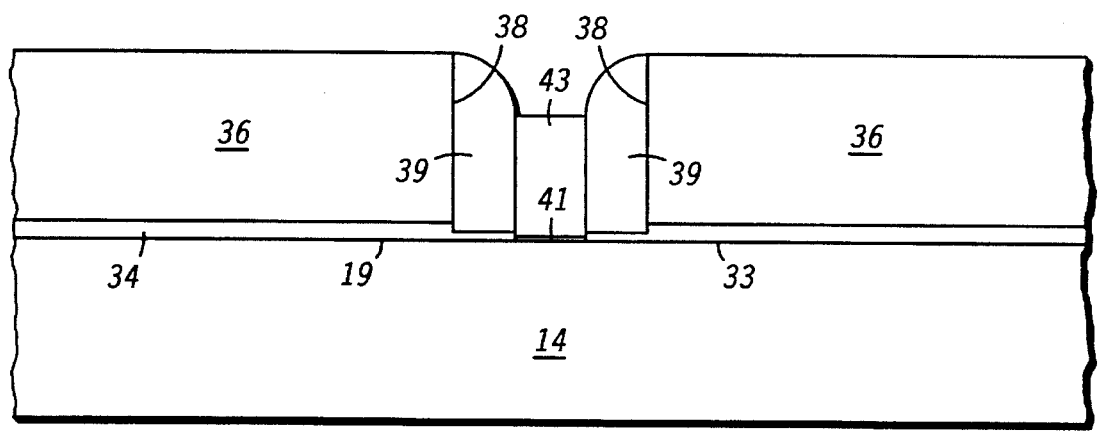

Now referring to FIG. 6, the layer of polysilicon 42 is anisotropically etched using, for example RIE. Preferably, the anisotropic etch removes the portion of the layer of polysilicon on the oxide layer 36 and leaves a polysilicon plug 43 between the oxide spacers 39. The polysilicon plug 43 and the gate oxide layer 41 between the polysilicon plug 43 and the major surface 19 serve as a first portion of a gate structure. In one embodiment, the polysilicon plug 43 has a width of approximately 0.3 μm and a height of approximately 5,000 angstroms. It should be noted that the oxide spacers 39 reduce the size of the polysilicon plug 43 to a smaller size than can be accomplished by currently manufacturable photolithographic techniques. It shall be understood that the method of reducing the polysilicon plug 43 is not a limitation of the present invention. Further, the scope of the present invention does not exclude polysilicon plugs 43 having larger or smaller dimensions. The polysilicon plug 43 is also referred to as a central gate electrode core, a portion of a gate structure, or a subphotolithographic core.

Figure 7:
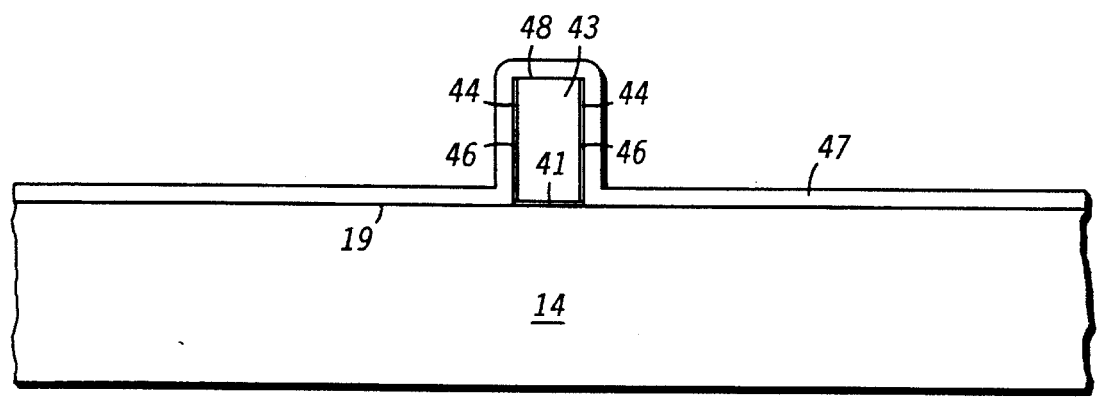

Now referring to FIG. 7, the oxide layer 36, the oxide spacers 39, the layer of silicon nitride 34, and the oxide layer 33 are removed using techniques well known to those skilled in the art. For example, the oxide layer 36, the oxide spacers 39, oxide layer 33 may be removed using a wet etchant such as hydrofluoric acid. Correspondingly, the removal of the silicon nitride layer 34 may be accomplished using hot phosphoric acid.

Oxide sidewall spacers 44 having a thickness of, for example, approximately 150 angstroms are selectively formed on the sidewalls 46 of the central gate electrode core 43. A common technique for forming the oxide sidewall spacers 44 is by means of thermal oxidation of the exposed surfaces of the central gate electrode core 43 and the major surface 19. This is followed by an anisotropic etch which substantially removes the thermal oxide except on the sidewalls 46. Thus oxide sidewall spacers 44 are formed on the sidewalls 46. The major surface 19 of the epitaxial layer 14, the oxide sidewall spacers 44, and a top portion 48 of the central gate electrode core 43 are conformally coated with a layer of silicon nitride 47 having a thickness of, for example, approximately 500 angstroms. Preferably, the layer of silicon nitride 47 is formed by LPCVD.

Figure 8:
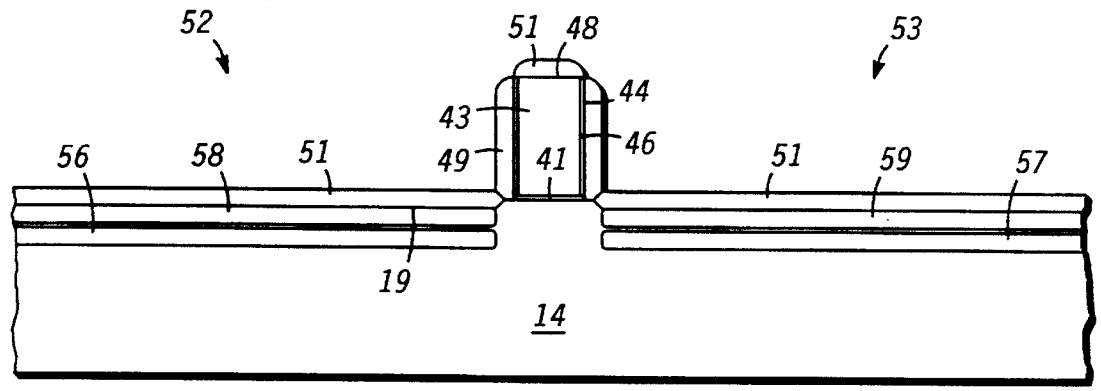

Now referring to FIG. 8, the layer of silicon nitride 47 is anisotropically removed using techniques well known to those skilled in the art. Anisotropic removal of the layer of silicon nitride 47 leaves nitride sidewall spacers 49 adjacent the oxide sidewall spacers 44, and exposes the top portion 48 of the central gate electrode core 43 as well as the portions of the major surface 19 adjacent the central gate electrode core 43. A layer of oxide 51 having a thickness of, for example, approximately 700 angstroms is formed on the exposed portions of the epitaxial layer 14 and the polysilicon of the central gate electrode core 43. In other words, the exposed top portion 48 and the exposed portions of the major surface 19 adjacent the central gate electrode core 43 are oxidized using a thermal oxidation technique. Techniques for thermally oxidizing semiconductor materials such as silicon and polysilicon are well known in the art.

In a first embodiment, an impurity material of P conductivity type, such as boron or boron difluoride, is implanted into a region 52 of the epitaxial layer 14 to form a dopant layer 56. A suitable set of implant parameters includes implanting the P type impurity material, boron, at a dose rangings between approximately $2 \times 10^{12}$ atoms per square centimeter (atoms/cm$^2$) and approximately $2 \times 10^{13}$ atoms/cm$^2$, and a suitable implant energy range between approximately 40 kilo-electron volts (KeV) and approximately 100 KeV. Thus, the P type impurity material is implanted into the epitaxial layer 14 at a first implant depth or distance.

An additional implant is performed, wherein the impurity material, boron, of P conductivity type is implanted into the region 52 to form a dopant layer 58. A suitable set of implant parameters for the additional implant include a dose ranging between approximately $5 \times 10^{11}$ atoms/cm$^2$ and approximately $1 \times 10^{13}$ atoms/cm$^2$, and a suitable implant energy range between approximately 10 KeV and approximately 20 KeV. Thus, the P type impurity material is implanted into the epitaxial layer 14 at a third implant depth or distance, wherein the first implant depth is preferably larger or greater than the third implant depth. The dopant layer 56 is vertically spaced apart from the dopant layer 58. Preferably the distance between the layers 56 and 58 is approximately 3,000 angstroms. Thus, the dopant level of the P conductivity type impurity material is increased in a portion of the epitaxial layer 14 adjacent at least one side of the central gate electrode core 43.

Further, an impurity material of N conductivity type, such as phosphorus, is implanted into a region 53 of the epitaxial layer 14 to form a dopant layer 57. An exemplary set of implant parameters includes a dose ranging between approximately $2 \times 10^{12}$ atoms/cm$^2$ and approximately $2 \times 10^{13}$ atoms/cm$^2$, and an implant energy ranging between approximately 120 KeV and approximately 240 KeV. Thus, the N type impurity material is implanted into the epitaxial layer 14 at a second implant depth or distance, wherein the second implant depth or distance is preferably substantially equal to the first implant depth.

Another implant into the region 53 forms a dopant layer 59, wherein the implant parameters for forming the dopant layer 59 include a dose ranging between approximately $5 \times 10^{11}$ atoms/cm$^2$ and approximately $1 \times 10^{13}$ atoms/cm$^2$ and an implant energy ranging between approximately 40 KeV and approximately 120 KeV. Thus, the N type impurity material is implanted into the epitaxial layer 14 at a fourth implant depth or distance, wherein the fourth implant depth or distance is preferably substantially equal to the third implant depth. The dopant layer 57 is vertically spaced apart from the dopant layer 59. Preferably the distance between the layers 57 and 59 is approximately 3,000 angstroms. It shall be understood the region 52 is adjacent one side of the portion of the gate electrode structure, i.e., the central gate electrode core 43 and underlying gate oxide 41 and the region 53 is adjacent an opposing side of the portion of the gate electrode structure. It shall be further understood that the implant of the regions 52 and 53 was presented as an example and is not a limitation of the present invention. In other words, the present invention may be implemented using a single but separate implant into each region 52 and 53 or using more than two implants into the regions 52 and 53. Use of more than two implants into the regions 52 and 53 may be used to more precisely tailor the dopant profiles in the regions 52 and 53.

Figure 9:
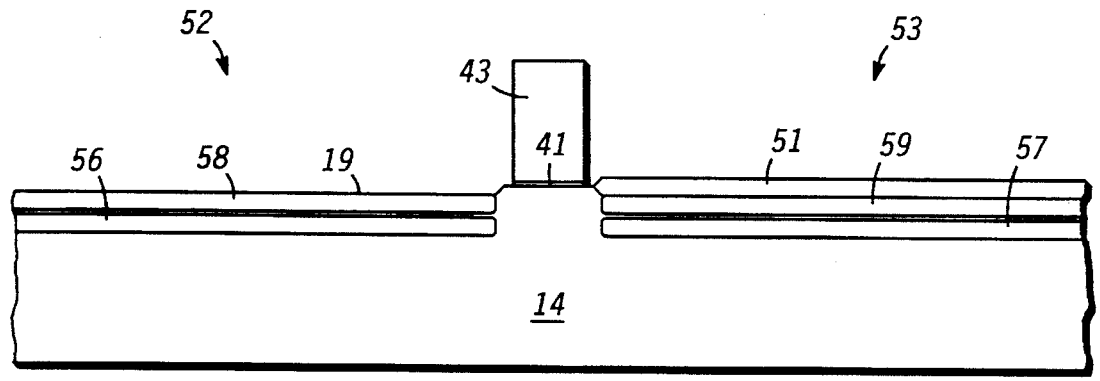

Now referring to FIG. 9, the layer of oxide 51 on the exposed portion of the epitaxial layer 14 in the region 52 and on the polysilicon of the central gate electrode core 43 is selectively removed. In addition, the nitride sidewall spacers 49 and the oxide sidewall spacers 44 are also removed. Techniques for selectively removing an oxide layer from a surface of a semiconductor material as well as removing nitride sidewall spacers and oxide sidewall spacers are well known to those skilled in the art. In addition, the layer of oxide 51 on the exposed portion of the epitaxial layer 14 in the region 53 is thinned simultaneously with the removal of the oxide sidewall spacers 44. By way of example, the thickness of the layer of oxide 51 after thinning is approximately 500 angstroms. Although not necessary, it is desirable to leave the layer of oxide 51 in the region 53, i.e., the drain region of the insulated gate semiconductor device. This thicker oxide serves to lower the gate to drain capacitance and therefore enhance the high frequency performance of the insulated gate semiconductor device while simultaneously increasing the drain to source breakdown voltage performance of the insulated gate semiconductor device.

Figure 10:
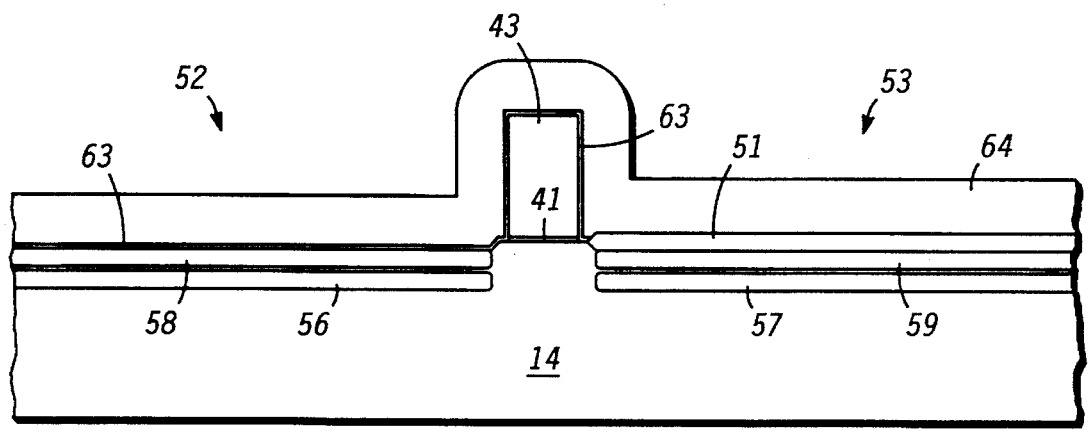

Now referring to FIG. 10, a layer of oxide 63, i.e., an insulating layer is formed over the regions 52 and 53, and over the central gate electrode core 43. Although not shown, it shall be understood that the formation of the layer of oxide 63 serves to thicken the layer of oxide 51 in the region 53. More particularly, the layer of oxide 63 is formed on the major surface 19 in the region 52 of the epitaxial layer 14, on the central gate electrode core 43, and on the layer of oxide 51 over the major surface 19 in the region 53 of the epitaxial layer 14. Preferably, the layer of oxide 63 has a thickness of approximately 105 angstroms and is formed by thermal oxidation, although other suitable techniques may be used. It shall be understood that formation of the layer of oxide 63 by thermal oxidation does not substantially increase the thickness of the layer of oxide 51. It shall be noted that if the layer of oxide 63 were formed by deposition, the thickness of the layer of oxide 51 would increase by a corresponding amount. A conformal layer of polysilicon 64 is formed on the layer of oxide 63. By way of example, the conformal layer of polysilicon 64 has a thickness of approximately 2,500 angstroms.

Figure 11:
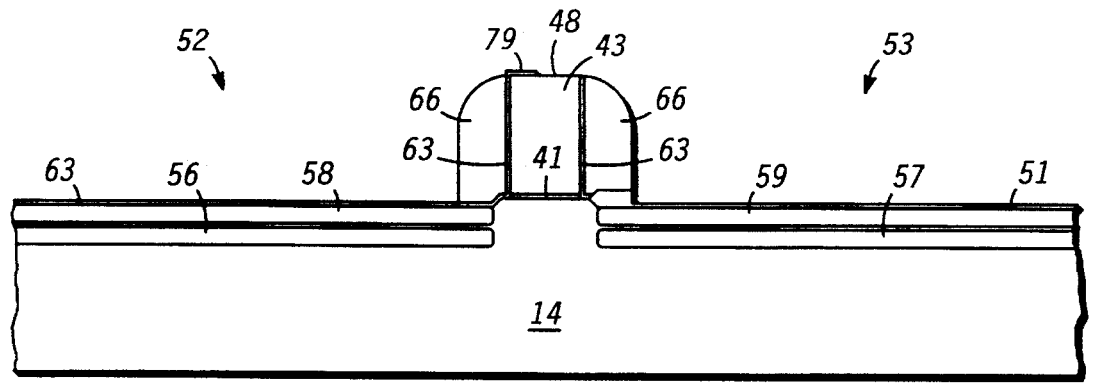

Now referring to FIG. 11, the conformal layer of polysilicon 64 is anisotropically etched to form sidewall spacers 66. The sidewall spacers serve as a second portion of the gate structure, wherein the second portion of the gate structure is adjacent to and spaced apart from the first portion of the gate structure by the oxide layer 63. After anisotropically etching the con formal layer of polysilicon 64 (i.e., after forming the sidewall spacers 66), the layer of oxide 63 over the major surface 19 in the region 52, the top portion 48 of the central gaze electrode core 43, and the layer of oxide 51 over the major surface 19 in the region 53 is exposed. Subsequently, the layer of oxide 51 in the region 53 is thinned by masking regions to one side of the center of central gate electrode core 43 (i.e., to the left side of the sidewall spacer 66 on the right side of the central gate electrode core as shown in FIG. 11) using photolithographic means. Exposed oxides on the side opposite the masked regions are etched and removed, or thinned (i.e., to the right side of the central gate electrode core). The masking of the left side of the central gate electrode core leaves an oxide region 79 on the masked side of the top portion 48. By way of example, the thickness of the remaining layer of oxide 51 in the region 53 ranges between approximately 50 and 200 angstroms.

Figure 12:
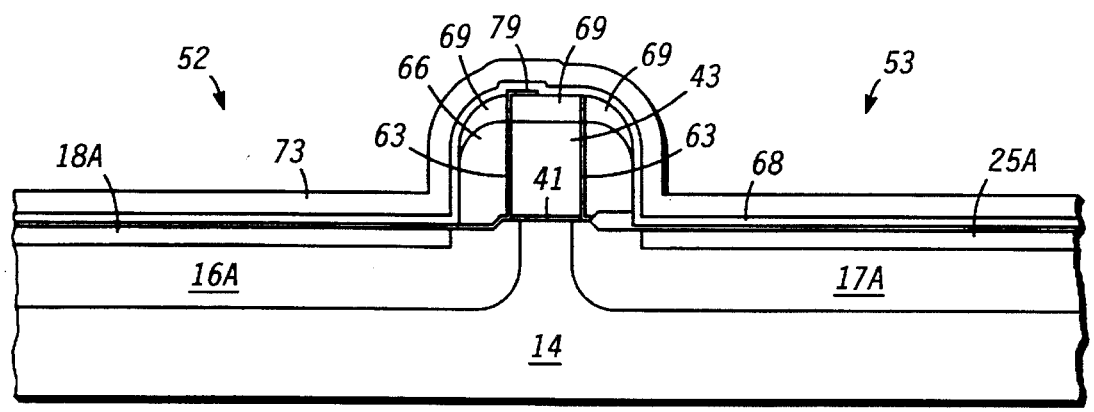

Now referring to FIG. 12, a layer of oxide 68 is conformally deposited on the central gate electrode core 43, the sidewall spacers 66, and over the regions 52 and 53. Preferably, the layer of oxide 68 is a conformal TEOS layer having a thickness of approximately 300 angstroms. A thermal anneal is performed to redistribute the impurity materials in the regions 52 and 53, and thereby form dopant wells 16A and 17A. The dopant wells 16A and 17A are referred to as a body region and a lightly doped drain extension region, respectively.

In accordance with the embodiment described supra, in which the dopant layers 56 and 58 are formed in the region 52 and the dopant layer 57 and 59 are formed in the region 53, a blanket source/drain implant is performed to form the source region 18A and the enhanced drain contact region 25A. In other words, the regions 52 and 53 are doped to form the source region 18A and the enhanced drain contact region 25A. In addition, the source/drain implant further dopes the gate structure comprising the central gate electrode core 43 and the sidewall spacers 66 to form the dopant region 69. A suitable set of implant parameters for the source/drain implant includes implanting an N type impurity material, such as arsenic, at a dose ranging between approximately $1 \times 10^{15}$ atoms per square centimeter (atoms/cm$^2$) and approximately $1 \times 10^{16}$ atoms/cm$^2$, and a suitable implant energy range between approximately 60 kilo-electron volts (KeV) and approximately 160 KeV.

Still referring to FIG. 12, a con formal layer of silicon nitride 73 is formed on the layer of oxide 68. By way of example, approximately 1,000 angstroms of silicon nitride is formed using LPCVD.

Figure 13:
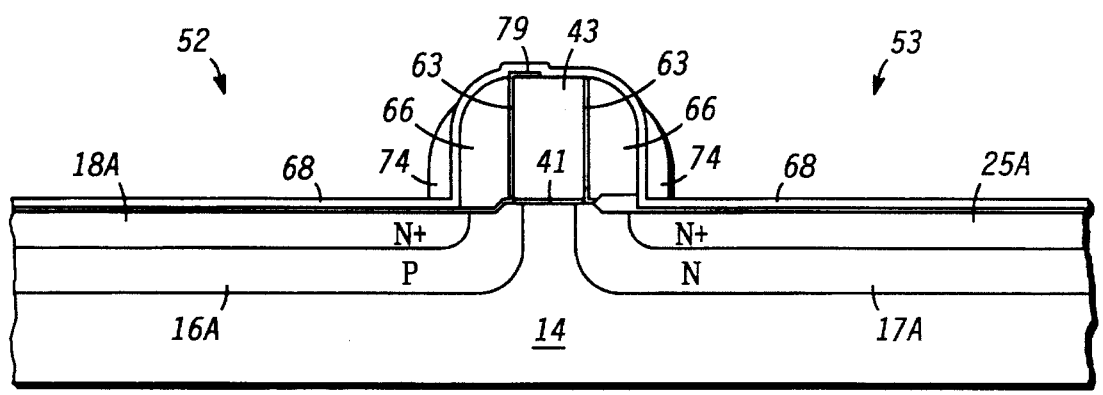

Now referring to FIG. 13, the source/drain implant is activated with a rapid thermal anneal (RTA) for approximately 45 seconds at a temperature of approximately 1,065° C. The RTA process redistributes the dopant or impurity atoms in the source and drain regions and in the gate structure, i.e., the central gate electrode core 43 and the sidewall spacers 66. Thus, central gate electrode core 43 and sidewall spacers 66 are of N conductivity type. It shall be understood that the type of anneal is not a limitation of the present invention, for example, furnace or laser activated thermal anneals may also be used.

The conformal layer of silicon nit ride 73 (shown in FIG. 12) is anisotropically etched to expose the layer of oxide 68 in the regions 52 and 53, and to form the nitride sidewall spacers 74. In other words, nitride sidewall spacers 74 are formed adjacent to and separated from the polysilicon sidewall spacers 66 by oxide layer 68.

Figure 14:
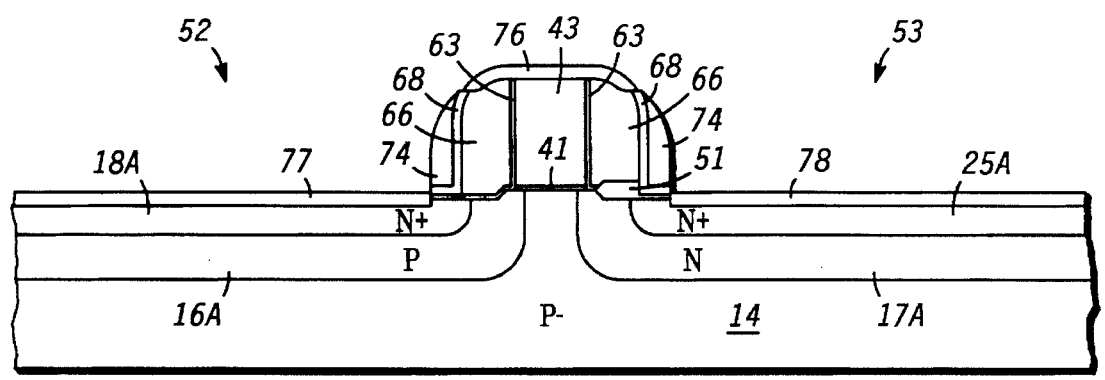

Now referring to FIG. 14, the exposed portions of the layer of oxide 68 and the oxide region 79 are removed using techniques well known in the art. Silicide is formed in the exposed polysilicon of the central gate electrode core 43, the exposed portions of the polysilicon sidewall spacers 66, and in the exposed silicon in the regions 52 and 53. It shall be understood that the silicide formed on the exposed silicon and polysilicon regions is formed simultaneously. A technique for selectively forming silicide can be found in U.S. Pat. No. 4,619,038 issued to Pintchovski on Oct. 28, 1986 and assigned to Motorola, Inc. The silicide 76 formed on the central gate electrode core 43 and the polysilicon sidewall spacers 66 serves as a conductive strap that electrically connects the central gate electrode core 43 to the sidewall spacers 66, i.e., the silicide 76 serves to contact and connect all portions of the gate electrode. The silicide 77 formed in the region 52 serves as a source region electrode or electrical contact and the silicide 78 formed in the region 53 serves as a drain region electrode or electrical contact. Optionally, a substrate contact (not shown) may be formed to the substrate to bias the substrate to the most negative supply voltage potential. Further, the optional substrate contact may be common to the dopant well 16A and the source region 18A. Thus, at least two electrical contacts 77 and 78 are formed to the portion of the epitaxial layer 14.

It shall be understood that alternate methods for doping the lightly doped drain extension region 17A and positioning the enhanced drain contact region 25A further from the gate structure may be employed to increase the drain to source breakdown voltage. Such methods may be found in, for example, U.S. Pat. No. 5,155,563 issued to Davies et al. on Oct. 13, 1992 and assigned to Motorola Inc.

Figure 15:
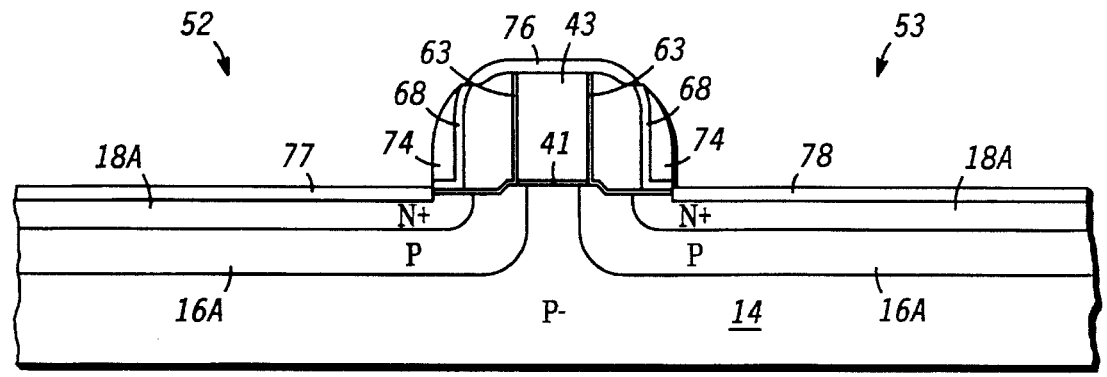
FIG. 15 illustrates a highly enlarged cross-sectional view of an insulated gate semiconductor device in accordance with a bilateral embodiment of the present invention.

FIG. 15 illustrates a cross-sectional view of a bilateral insulated gate semiconductor device 81 in accordance with another embodiment of the present invention. Semiconductor device 81 is a symmetrical device having body regions 16A on both sides of central gate electrode core 43. A bilateral device can be fabricated using the process described in FIGS. 1–14 with the modification that an impurity material of the same conductivity type and concentration are used to form the dopant layers 57 and 59 as were used to form the dopant layers 56 and 58 as shown in FIG. 8. In other words, an impurity material of P conductivity type, such as boron or boron difluoride, is implanted into a region 53 of the epitaxial layer 14. A suitable set of implant parameters includes implanting the P type impurity material, boron, at a dose ranging between approximately $2\times10^{12}$ atoms per square centimeter (atoms/cm$^2$) and approximately $2\times 10^{13}$ atoms/cm$^2$, and a suitable implant energy range between approximately 40 kilo-electron volts (KeV) and approximately 100 KeV. Thus, the P type impurity material is implanted into the epitaxial layer 14 at a fifth implant depth or distance.

An additional implant is performed, wherein the impurity material, boron, of P conductivity type is implanted into the region 53. A suitable set of implant parameters for the additional implant include a dose ranging between approximately $5\times10^{11}$ atoms/cm$^2$ and approximately $1\times10^{13}$ atoms/cm$^2$ and a suitable implant energy range between approximately 10 KeV and approximately 20 KeV. Thus, the P type impurity material is implanted into the epitaxial layer 14 at a sixth implant depth or distance, wherein the fifth implant depth is preferably larger or greater than the sixth implant depth.

In addition, the source and drain of the bilateral device are interchangeable and thus the device includes source/drain regions 18A formed as described for the formation of the region 18A of FIG. 12. It should be noted that in the bilateral device, the portion of the oxide layer 51 in the region 53 will be removed simultaneously with the portion of the oxide layer 51 in the region 52. The resulting device is a symmetrical bidirectional device having two enhancement mode portions and a depletion mode portion instead of an enhancement mode portion, a depletion mode portion, and a lightly doped drain extension region as described for a unilateral device.

Figure 16:
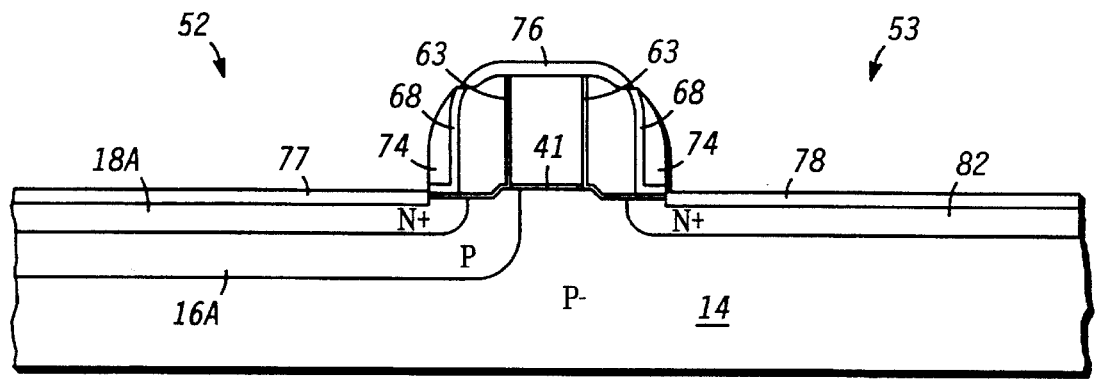
FIG. 16 illustrates a highly enlarged cross-sectional view of an insulated gate semiconductor device in accordance width another unilateral embodiment of the present invention.

FIG. 16 illustrates a cross-sectional view of an insulated gate semiconductor device 86 in accordance with yet another embodiment of the present invention. The insulated gate semiconductor device 86 is a unilateral device formed using the process described in FIGS. 4–14 with the modification that the impurity material of N conductivity type is not implanted into the region 53 to form the dopant layers 57 and 59. Thus, the lightly doped drain extension region 17A is not formed in the insulated gate semiconductor device 86. Further, the layer of oxide 51 is removed from the region 53 simultaneously with the layer of oxide 51 on the exposed portion of the epitaxial layer 14 in the region 52.

Accordingly, the insulated gate semiconductor device 86 comprises a P conductivity type epitaxial layer 14 having a dopant well 16A of P conductivity type and a source region 18A extending into the dopant well 16A. A drain region 82 extends into the epitaxial layer 14, wherein the drain region 82 is laterally spaced apart from the dopant well 16A. Formation of the drain region 82 is analogous to the formation of the drain contact region 25A.

Figure 17:
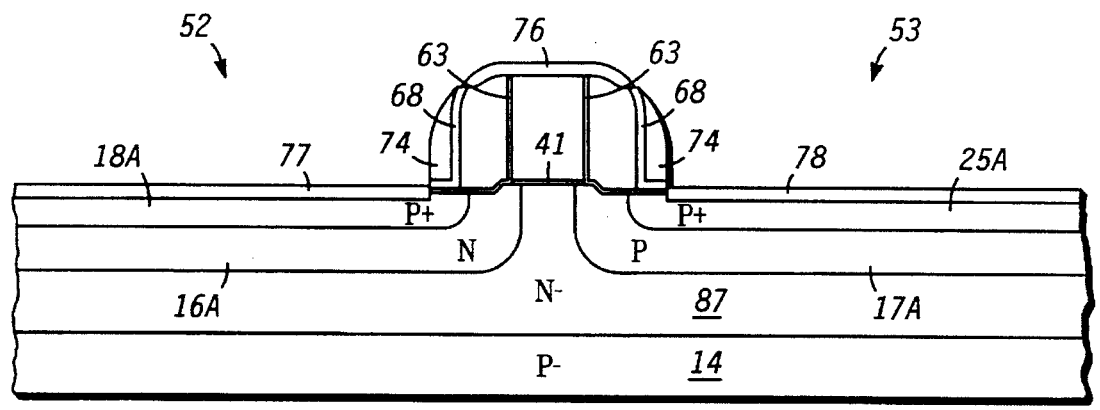
FIG. 17 illustrates a highly enlarged cross-sectional view of an insulated gate semiconductor device in accordance with yet another unilateral embodiment of the present invention.

FIG. 17 illustrates a cross-sectional view of a unilateral insulated gate semiconductor device 91 in accordance with yet another embodiment of the present invention. The unilateral insulated gate semiconductor device 91 comprises an N-well 87 in the P conductivity type epitaxial layer 14 which permits formation of complementary insulated gate semiconductor devices. In other words, a complementary insulated gate P channel device may be formed in the N-well 87, wherein the device structure of the insulated gate semiconductor device 91 provides a complementary device to the device structure 10 shown in FIGS. 4–14. Although only a portion of the N-well 87 is illustrated, it shall be understood that the N-well 87 serves as an isolation well. The complementary insulated gate semiconductor device 91 may be formed by inverting the doping types for the regions described with reference to FIGS. 4–14 for the insulated gate semiconductor device 10. The resulting P channel device, in conjunction with the N channel device 10 (FIGS. 4–14) may be combined to implement complementary insulated gate semiconductor device circuitry in a common epitaxial layer such as epitaxial layer 14.

Figure 18:
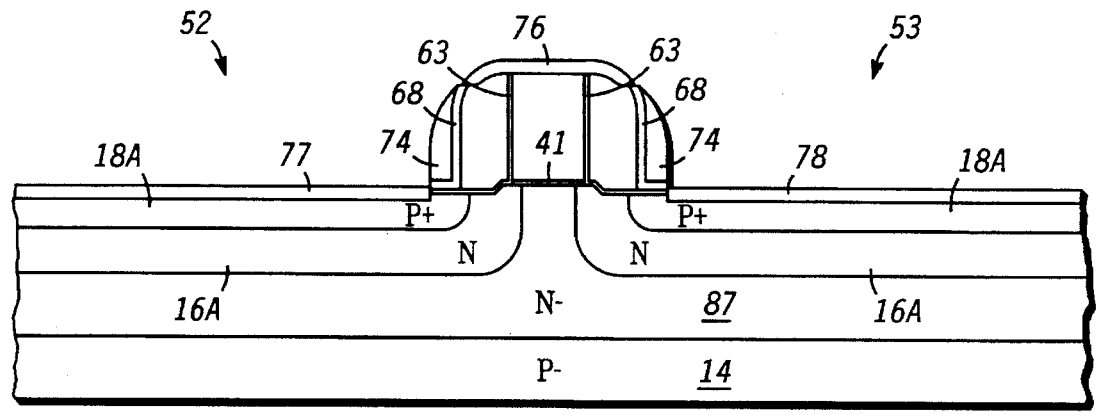
FIG. 18 illustrates a highly enlarged cross-sectional view of an insulated gate semiconductor device in accordance with a complementary bilateral embodiment of the present invention.

FIG. 18 illustrates a cross-sectional view of a bilateral insulated gate semiconductor device 93 in accordance with yet another embodiment of the present invention. The semiconductor device 93 is a complementary device to the semiconductor device 81 described in FIG. 15. The bilateral insulated gate semiconductor device 93 comprises an N-well 87 in the P conductivity type epitaxial layer 14 which permits formation of complementary insulated gate semiconductor devices. In other words, a complementary insulated gate P channel device may be formed in the N-well 87, wherein the device structure of the insulated gate semiconductor device 93 provides a complementary device to the device structure 81 shown in FIG. 15. Although only a portion of the N-well 87 is illustrated, in shall be understood that the N-well 87 serves as an isolation well. The complementary insulated gate semiconductor device 93 may be formed by inverting the doping types for the regions described with reference to FIG. 15 for the insulated gate semiconductor device 81. The resulting P channel device, in conjunction with the N channel device 81 (FIG. 15) may be combined to implement complementary insulated gate semiconductor device circuitry in a common epitaxial layer such as epitaxial layer 14.

By now it should be appreciated that an insulated gate semiconductor device structure and method of forming the insulated gate semiconductor device structure have been provided. The insulated gate semiconductor device structure of the present invention provides a means for controlling $V_T$ such that the insulated gate semiconductor device is suitable for low voltage circuit applications. More particularly, insulated gate semiconductor devices fabricated in accordance with the present invention comprise a channel region having an enhancement mode portion and a depletion mode portion wherein the separate regions create a stepped channel. The enhancement and depletion mode portions are regions each having their own constant carrier concentration, wherein the carrier concentration in the enhancement mode portion is higher than that of the depletion mode portion and represents the peak channel region concentration. Accordingly, the peak channel region concentration remains constant for a significant portion of the enhancement channel length. This results in a slightly larger effective channel length and a significantly more controlled threshold voltage value.

While specific embodiments of the present invention have been shown and described, further modifications. and improvements will occur to those skilled in the art. It is understood that the invention is not limited to the particular forms shown and it is intended for the appended claims to cover all modifications which do not depart from the spirit and scope of this invention. For example, a P channel device can be formed in an N-well, wherein the P channel device is analogous to the insulated gate semiconductor device 86 shown in FIG. 16.

We claim:

1. An insulated gate semiconductor device, comprising:

a semiconductor substrate of a first conductivity type and having a major surface;

a first dopant well of the first conductivity type extending a first distance into the semiconductor substrate from the major surface;

a second dopant well of a second conductivity type inside and extending a second distance into the first dopant well from the major surface, wherein an interface between the first and second dopant wells forms a P,N junction, and a portion of the first dopant well adjacent a first portion of the major surface and laterally bounded by a portion of the P-N junction and a portion of a boundary between the first dopant well and the semiconductor substrate serves as a first channel portion of the insulated gate semiconductor device, the first channel portion having a constant surface doping concentration of a first value, and wherein the first and second conductivity types are different, and the second distance is less than the first distance;

a third dopant well of the second conductivity type extending a third distance into the semiconductor substrate from the major surface, the third dopant well laterally spaced apart from the first dopant well by a portion of the semiconductor substrate adjacent a second portion of the major surface and laterally bounded by the third dopant well and the portion of the boundary between the first dopant well and the semiconductor substrate, wherein the portion of the semiconductor substrate adjacent the second portion of the major surface and laterally bounded by the third dopant well and the portion of the boundary between the first dopant well and the semiconductor substrate serves as a second channel portion of the insulated gate semiconductor device, the second channel portion having a constant surface doping concentration of a second value, wherein the second value is less than the first value;

a gate oxide on at least a portion of the major surface between the second dopant well and the third dopant well;

a first portion of a gate electrode structure on the gate oxide, the first portion of the gate electrode structure being of the second conductivity type;

a second portion of the gate electrode structure on the gate oxide and adjacent to and spaced apart from the first portion of the gate electrode structure by a dielectric material, the second portion of the gate electrode structure being of the second conductivity type;

a third portion of the gate electrode structure on the gate oxide and adjacent to and spaced apart from another side of the first portion of the gate electrode structure by the dielectric material, the third portion of the gate electrode structure being of the second conductivity type;

a conductive strap coupling the first, second, and third portions of the gate electrode structure, the conductive strap serving as a gate electrode;

a first electrode contacting a portion of the second dopant well; and a second electrode contacting the third dopant well.

2. The insulated gate semiconductor device of claim 1, wherein the first conductivity type is P conductivity type and the second conductivity type is N conductivity type.

3. The insulated gate semiconductor device of claim 1, wherein the gate oxide between the third portion of the gate electrode structure and the major surface is thicker than the gate oxide between the second portion of the gate electrode structure and the major surface.

4. The insulated gate semiconductor device of claim 1, further including a fourth dopant well of the first conductivity type extending a fourth distance into the semiconductor substrate from the major surface, the fourth dopant well laterally spaced apart from the first dopant well and surrounding the third dopant well.

5. The insulated gate semiconductor device of claim 1, further including a fourth dopant well of the second conductivity type extending a fourth distance into the semiconductor substrate from the major surface, the fourth dopant well laterally spaced apart from the first dopant well and surrounding the third dopant well.

6. The insulated gate semiconductor device of claim 4, wherein the semiconductor substrate of the first conductivity type comprises an isolation well of the first conductivity type within a semiconductor material of the second conductivity type.

7. The insulated gate semiconductor device of claim 4, wherein the first conductivity type is N conductivity type and the second conductivity type is P conductivity type.

8. The insulated gate semiconductor device of claim 5, wherein the semiconductor substrate of the first conductivity type comprises an isolation well of the first conductivity type within a semiconductor material of the second conductivity type.

9. The insulated gate semiconductor device of claim 5, wherein the first conductivity type is N conductivity type and the second conductivity type is P conductivity type.

10. An insulated gate semiconductor device, comprising:

a semiconductor substrate of a first conductivity type and having a major surface;

an isolation well of a second conductivity type extending a first distance into the semiconductor substrate;

a first dopant well of the second conductivity type extending a second distance into the isolation well from the major surface, wherein the second distance is less than the first distance;

a second dopant well of the first conductivity type inside and extending a third distance into the first dopant well from the major surface, Wherein an interface between the first and second dopant wells forms a P-N junction, and a portion of the first dopant well adjacent a first portion of the major surface and laterally bounded by a portion of the P-N junction and a portion of a boundary between the first dopant well and the isolation well serves as a first channel portion of the insulated gate semiconductor device, the first channel portion having a constant surface doping concentration of a first value, and wherein the first and second conductivity types are different and the third distance is less than the second distance;

a third dopant well of the first conductivity type extending a fourth distance into the isolation well from the major surface, the third dopant well laterally spaced apart from the first dopant well by a portion of the isolation well adjacent second portion of the major surface and laterally bounded by the third dopant well and the portion of the boundary between the first dopant well and the isolation well, wherein the portion of the isolation well adjacent the second portion of the major surface and laterally bounded by the third dopant well and the portion of the boundary between the first dopant well and the isolation well serves as a second channel portion of the insulated gate semiconductor device, the second channel portion having a constant surface doping concentration of a second value, wherein the second value is less than the first value;

a gate oxide on at least a portion of the major surface between the second dopant well and the third dopant well;

a first portion of a gate electrode structure on a first portion of the gate oxide, the first portion of the gate electrode structure being of the first conductivity type;

a second portion of the gate electrode structure adjacent to and spaced apart from the first portion of the gate electrode structure by a dielectric material, the second portion of the gate electrode structure being of the first conductivity type;

a third portion of the gate electrode structure adjacent to and spaced apart from another side of the first portion of the gate electrode structure by the dielectric material, the third portion of the gate electrode structure being of the first conductivity type;

a conductive strap coupling the first, second, and third portions of the gate electrode structure, the conductive strap serving as a gate electrode;

a first electrode contacting a portion of the second dopant well; and a second electrode contacting the third dopant well.

11. The insulated gate semiconductor device of claim 10, wherein the first conductivity type is P conductivity type and the second conductivity type is N conductivity type.

12. The insulated gate semiconductor device of claim 10, further including a fourth dopant well of the second conductivity type extending a fifth distance into the semiconductor substrate from the major surface, the fourth dopant well laterally spaced apart from the first dopant well and surrounding the third dopant well on three sides.

13. The insulated gate semiconductor device of claim 10, further including a fourth dopant well of the first conductivity type extending a fifth distance into the semiconductor substrate from the major surface, the fourth dopant well laterally spaced apart from the first dopant well and surrounding the third dopant well on three sides.

14. The insulated gate semiconductor device of claim 10, wherein the first conductivity type is N conductivity type and the second conductivity type is P conductivity type.

15. The insulated gate semiconductor device of claim 10, wherein the second portion of the gate electrode structure is on a second portion of the gate oxide and the third portion of the gate electrode structure is on a third portion of the gate oxide.

16. The insulated gate semiconductor device of claim 15, wherein the third portion of the gate oxide is thicker than the second portion of the gate oxide.

* * * * *

UNITED STATES PATENT AND TRADEMARK OFFICE
CERTIFICATE OF CORRECTION

PATENT NO. : 5,510,648
DATED : April 23, 1996
INVENTOR(S) : Robert B. Davies et al.

It is certified that error appears in the above-indentified patent and that said Letters Patent is hereby corrected as shown below:

In claim 1, column 11, line 14, delete "P,N" and insert --P-N--.

In claim 10, column 12, line 48, delete "Wherein" and insert --wherein--.

In claim 10, column 12, line65, insert --a-- between "adjacent second".

Signed and Sealed this

Fifteenth Day of April, 1997

*Attest:*

BRUCE LEHMAN

*Attesting Officer*      *Commissioner of Patents and Trademarks*